US008831146B2

United States Patent
Au Yeung et al.

(10) Patent No.: US 8,831,146 B2
(45) Date of Patent: Sep. 9, 2014

(54) COMMUNICATION SYSTEM WITH ITERATIVE DETECTOR AND DECODER AND METHOD OF OPERATION THEREOF

(75) Inventors: Chun Kin Au Yeung, San Diego, CA (US); Hanju Kim, San Diego, CA (US); Jungwon Lee, San Diego, CA (US); Inyup Kang, San Diego, CA (US)

(73) Assignee: Samsung Electronics Co., Ltd., Gyeongg-Do (KR)

( * ) Notice: Subject to any disclaimer, the term of this patent is extended or adjusted under 35 U.S.C. 154(b) by 34 days.

(21) Appl. No.: 13/523,824

(22) Filed: Jun. 14, 2012

(65) Prior Publication Data

US 2013/0336430 A1      Dec. 19, 2013

(51) Int. Cl.
*H04L 27/00* (2006.01)

(52) U.S. Cl.
USPC ........... 375/340; 375/148; 375/150; 375/260; 375/267; 375/347

(58) Field of Classification Search
CPC . H04L 1/005; H04L 25/03171; H04L 1/0055; H04L 25/067; H04L 1/0631; H04L 27/38; H04L 1/0054; H04L 1/0047; H04L 25/03968; H03M 13/3905; H03M 13/1111; H03M 13/1105; H03M 13/3927; H03M 13/2948
USPC ................. 375/340, 148, 150, 260, 267, 347; 714/751, 755, 758, 780
See application file for complete search history.

(56) References Cited

U.S. PATENT DOCUMENTS

| | | | |
|---|---|---|---|
| 7,154,936 B2 | 12/2006 | Bjerke et al. | |
| 7,372,896 B2 | 5/2008 | Bjerke et al. | |
| 7,720,181 B2 | 5/2010 | Park et al. | |
| 8,027,401 B2 | 9/2011 | Hwang et al. | |
| 8,238,273 B2 * | 8/2012 | Shimizu et al. | 370/310 |
| 8,516,347 B1 * | 8/2013 | Li et al. | 714/780 |
| 2006/0188044 A1 * | 8/2006 | Wang et al. | 375/347 |
| 2010/0183065 A1 | 7/2010 | Siti et al. | |
| 2011/0075287 A1 | 3/2011 | Risso et al. | |

FOREIGN PATENT DOCUMENTS

EP       1655845 A1     5/2006

* cited by examiner

*Primary Examiner* — Dhaval Patel
(74) *Attorney, Agent, or Firm* — IP Investment Law Group

(57) ABSTRACT

A method of operation of a communication system includes: retaining an a-posteriori detector-data, a detector-extrinsic-information, an a-posteriori-decoder-data, a decoder-extrinsic-value, or a combination thereof calculated from a received signal; determining an a-priori-decoder-information or an a-priori detector-information from the a-posteriori detector-data, the detector-extrinsic-information, the a-posteriori-decoder-data, the decoder-extrinsic-value, or a combination thereof; and adjusting the a-posteriori detector-data, the detector-extrinsic-information, the a-posteriori-decoder-data, the decoder-extrinsic-value, or a combination thereof using the a-priori-decoder-information or the a-priori detector-information for communicating through a device.

20 Claims, 6 Drawing Sheets

COMMUNICATION SYSTEM WITH ITERATIVE DETECTOR AND DECODER AND METHOD OF OPERATION THEREOF

TECHNICAL FIELD

The present invention relates generally to a communication system, and more particularly to a system for detecting and decoding communication signals.

BACKGROUND ART

Modern portable consumer and industrial electronics, such as navigation systems, cellular phones, portable digital assistants, and combination devices, are providing increasing levels of functionality to support modern life including mobile communication. As users become more empowered with the growth of mobile communication technology, new and old paradigms begin to take advantage of this new device space.

The ever increasing need for information in modern life requires users to have access to information at all times, at increasing data rates. However, signals used in mobile communication effectively experience various types of interference from numerous sources, which affect the quality and speed of the accessible data.

Thus, a need still remains for a communication system with iterative detector and decoder. In view of the increasing consumer needs, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a communication system including: retaining an a-posteriori detector-data, a detector-extrinsic-information, an a-posteriori-decoder-data, a decoder-extrinsic-value, or a combination thereof calculated from a received signal; determining an a-priori-decoder-information or an a-priori detector-information from the a-posteriori detector-data, the detector-extrinsic-information, the a-posteriori-decoder-data, the decoder-extrinsic-value, or a combination thereof; and adjusting the a-posteriori detector-data, the detector-extrinsic-information, the a-posteriori-decoder-data, the decoder-extrinsic-value, or a combination thereof using the a-priori-decoder-information or the a-priori detector-information for communicating through a device.

The present invention provides a communication system, including: an access module for retaining an a-posteriori detector-data, a detector-extrinsic-information, an a-posteriori-decoder-data, a decoder-extrinsic-value, or a combination thereof; a detector module, coupled to the access module, includes: a pre-detection module for determining an a-priori detector-information from the a-posteriori detector-data, the detector-extrinsic-information, the a-posteriori-decoder-data, the decoder-extrinsic-value, or a combination thereof, a detector-calculation module for adjusting the a-posteriori detector-data, the detector-extrinsic-information, or a combination thereof using the a-priori detector-information; a decoder module, coupled to the access module, includes: a pre-decoding module for determining an a-priori-decoder-information from the a-posteriori detector-data, the detector-extrinsic-information, the a-posteriori-decoder-data, the decoder-extrinsic-value, or a combination thereof, and a decoder-calculation module for adjusting the a-posteriori-decoder-data, the decoder-extrinsic-value, or a combination thereof using the a-priori-decoder-information for communicating through a device.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
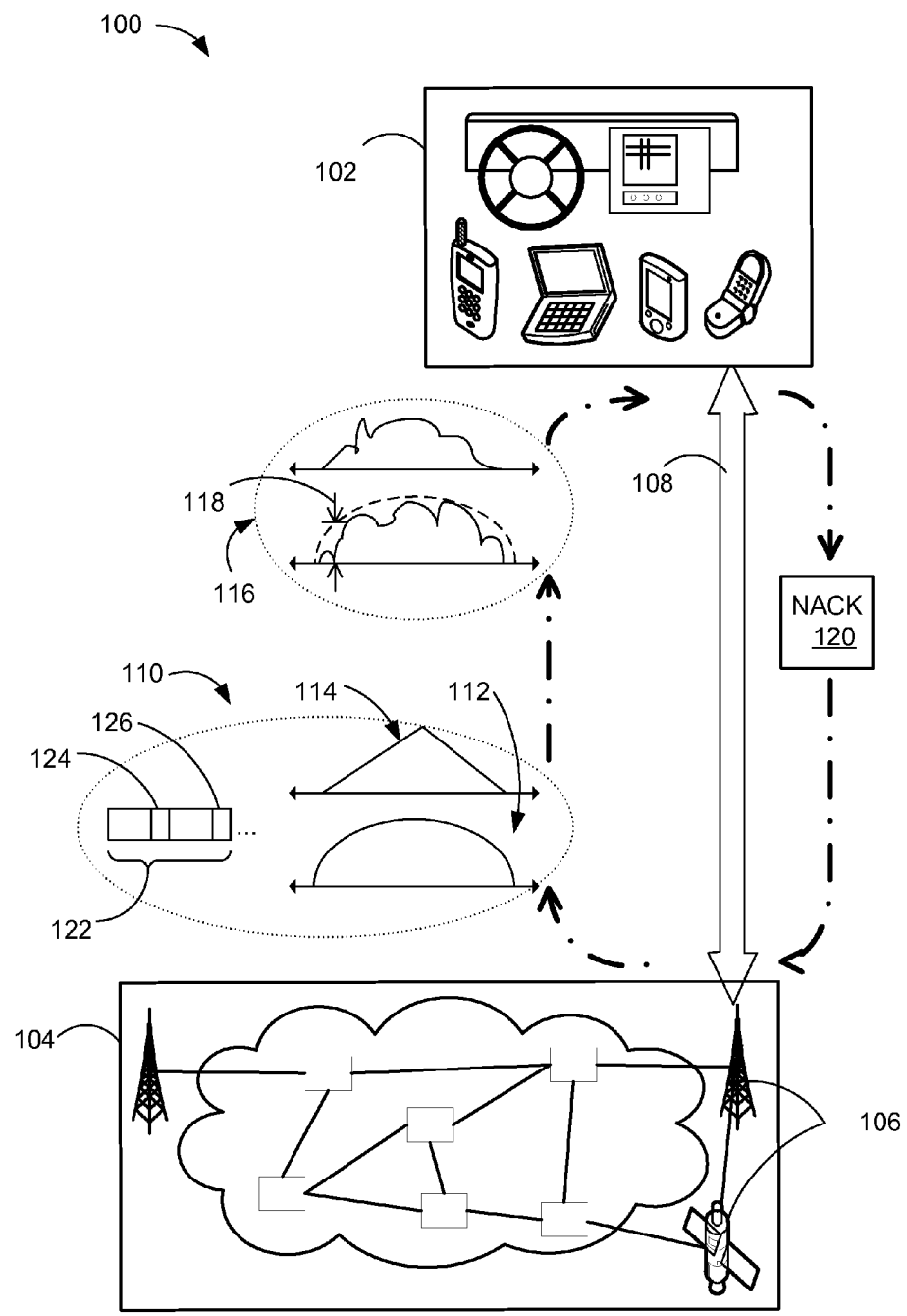
FIG. 1 is a communication system with shared-access iterative detection and decoding mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The term "module" referred to herein can include software, hardware, or a combination thereof in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof.

The term "processing" as used herein includes filtering signals, decoding symbols, assembling data structures, transferring data structures to peripheral storage devices, manipulating data structures, and reading data structures from external sources. Data structures are defined to be files, input data, system generated data, such as calculated data, and program data.

Referring now to FIG. 1, therein is shown a communication system 100 with shared-access iterative detection and decoding mechanism in an embodiment of the present invention. The communication system 100 includes a mobile station 102, such as a cellular phone or a notebook computer, connected to a network 104. The network 104 is defined as a system of wires, wired or wireless communications devices, or a combination thereof that are connected to each other for enabling communication between devices.

For example, the network 104 can be a combination wireless cellular phone network having base stations, communication towers and antennae, telephone network, servers, or client devices that are used to enable wireless communication. Also, for example, the network 104 can be a combination of wired or wireless routers, Ethernet cables, computers, or servers for local area networks.

The network 104 can include a base station 106 that is used to receive, transmit, relay, process or combination thereof, for wireless signals. The base station 106 can facilitate the communication with the mobile station 102 by sending, receiving, and relaying communication signals to and from the mobile station 102. The mobile station 102 can be connected to the network 104 through the base station 106.

For example, the base station 106 can be a cell tower, a wireless router, an antenna, or a combination thereof being used to send signals to or receive signals from the mobile station 102, such as a laptop computer or a cellular phone. The base station 106 can relay the signal through the network 104 to enable communication with other user equipment, server, computer, or a combination thereof.

The base station 106 can be used to transmit the communication signals, such as voice signals of a telephone call or a webpage. The base station 106 can also send reference signals or by broadcasting previously determined training signals to the mobile station 102. The mobile station 102 can receive and process signals from the base station 106.

Based on the communication method, such as code division multiple access (CDMA), orthogonal frequency-division multiple access (OFDMA), Third Generation Partnership Project (3GPP) Long Term Evolution (LTE), or the fourth generation (4G) telecommunication, the communication signals can also have reference signals imbedded in the communicated information. The reference signals can exist as a predetermined bit, pulse, wave, or a combination thereof. The reference signals can be embedded within the communicated information at a regular time interval, frequency, code, or a combination thereof.

The mobile station 102 can communicate with the base station 106 through a channel 108. The channel 108 can be wireless, wired, or a combination thereof. The channel 108 can also include repeaters, amplifiers, or a combination thereof.

For example, the channel 108 can encompass frequency, time slot, packet designation, channel code, or combination thereof used for transmission of signals. Also, for example, the channel 108 can include the behavior of the medium, such as reflection and loss caused by wires or refractions and obstructions in wireless environments.

The base station 106 can have a transmitted signal 110. The transmitted signal 110 can include the information sent to the mobile station 102, other users or receivers, or a combination thereof. The transmitted signal 110 can be formatted according to predetermined formats. For example, the transmitted signal 110 can have multiplexing scheme, modulation, signal strength, carrier frequency, synchronizing symbols or code words, error checking or correcting bits, such as parity information, or a combination thereof.

For illustrative purposes, the base station 106 will be described as transmitting signals and the mobile station 102 as receiving and replying to the transmitted signals. However, it is understood that both the mobile station 102 and the base station 106 can each transmit and receive signals.

The communication system 100 can employ a multiple-input and multiple-output (MIMO) scheme for communicating with the various users through multiple antennas. The communication system 100 transmitting the transmitted signal 110 in the MIMO scheme can have a main layer 112 and a separate layer 114.

The main layer 112 can be a set of information communicated through a particular antenna or a particular set of antennas. The separate layer 114 can be a set of information, that is the same or different from that of the main layer 112, which is communicated through an antenna or a set of antennas different from that of the main layer 112. Each layer can transmit a group of information to a specific user.

For illustrative purposes, the transmitted signal 110 will be described as having one each of the main layer 112 and the separate layer 114. However, it is understood that the transmitted signal 110 can have different number of layers. Further, it is understood that the transmitted signal 110 can have more than one layer dedicated to the mobile station 102, other user, or a combination thereof.

For further illustrative purposes, the number of antennas at the mobile station 102 will be described as being greater than or equal to the number of antennas at the base station 106 used to transmit to the mobile station 102. However, it is understood that the number of antennas at the mobile station 102 can be less than that of the base station 106.

The mobile station 102 can receive a received signal 116. The received signal 116 is defined as the overall signal perceived at the mobile station 102. The mobile station 102 can process the information in the received signal 116, relay the information to the user, such as by displaying or creating sounds, or a combination thereof.

The received signal 116 can be the transmitted signal 110 received at the mobile station 102 after the transmitted signal 110 travels through the channel 108. The transmitted signal 110 can experience distortion 118 such that the received signal 116 is not identical to the transmitted signal 110. The distortion 118 can be caused by channel gain, reflections, refractions, delay spread, phase shift, interference between the layers, signal from other sources, or a combination thereof.

For example, the information in the main layer 112 of the transmitted signal 110 can have a frequency response that resembles a semicircle. The distortion 118 can cause the information in the main layer 112 to degrade and lose the semicircle shape. Furthermore, the mobile station 102 will not see the information in the main layer 112 alone, but combined with the information in the separate layer 114, which has also been distorted.

The distortion 118 can change the transmitted signal 110 and the mobile station 102 can receive erroneous data. In cases when the mobile station 102 cannot detect or decode the signal, the mobile station can send a negative acknowledgement 120.

The negative acknowledgement 120 can be a predetermined message that signifies detection of erroneous data, failure in detecting or decoding the received signal 116, or a combination thereof. The negative acknowledgement 120 can be a bit, a symbol, data word, or a combination thereof predetermined by the communication system 100, software manufacturer, hardware manufacturer, or a combination thereof.

The base station 106 can repeat the transmission upon receiving the negative acknowledgement 120. The base station 106 can retransmit the exact same set of signals or a different set of signals. The retransmission and the negative acknowledgement 120 can repeat until the mobile station 102 does not transmit the negative acknowledgement 120. The number of retransmissions can also be limited according to a predetermined amount.

Also, the base station 106 can transmit the transmitted signal 110 using a code word 122. The code word 122 is defined as a recognized grouping of information within the transmitted signal 110. The code word 122 can be a sequence of bits or symbols having a known length, a known location within the transmitted signal 110, or both. For example, the code word 122 can be a byte, a grouping of two symbols, or a group of data between each reference portions within the transmitted signal 110.

The transmitted signal 110 can be a sequence of multiple instances of the code word 122 having unique values. The sequence of the code words can communicate data intended for transmission.

The code word 122 can be a portion of data intended for communication or a rearranged combination thereof for transmission purposes. The code word 122 can be determined from the data intended for communication using a known method of varying the amplitude, frequency, phase, or a combination thereof for a signal to signify a bit or a combination of bits. The code word 122 can be a symbol, a reference data, synchronizing field, communicated payload data, error check or correcting data, or a combination thereof.

The code word 122 can be estimated, corrected, or a combination thereof using a parity bit 124 and a latter parity 126. The parity bit 124 can be error checking or forward error correcting information for estimating or correcting a portion of data in the received signal 116. The latter parity 126 can be error checking or forward error correcting information for estimating or correcting a different portion of data in the received signal 116. For example, the parity bit 124 can be paired with the first half of the code word 122 and the latter parity 126 can be paired with the second half of the code word 122.

The parity bit 124, the latter parity 126, or both can be included within the code word 122 or within the transmitted signal 110 separate from the code word 122. The parity bit 124, the latter parity 126, or both can also be generated by the mobile station 102 using the received signal 116. The mobile station 102 can use the parity bit 124, the latter parity bit 126, or both to validate estimations, decoding, correcting, or a combined operation thereof for the code word 122.

The transmitted signal 110 can be a sequence of independent values of the code word 122. The code word 122 can have both information from the main layer 112 and the separate layer 114 combined therein. For example, the code word 122 can have information from the main layer 112 in the first half and information from the separate layer 114 in the second half of the code word 122. Also, for example, the transmitted signal 110 can have one instance of the code word 122 having the information from the main layer 112 followed by a separate instance of the code word 122 having the information from the separate layer 114.

Figure 2:
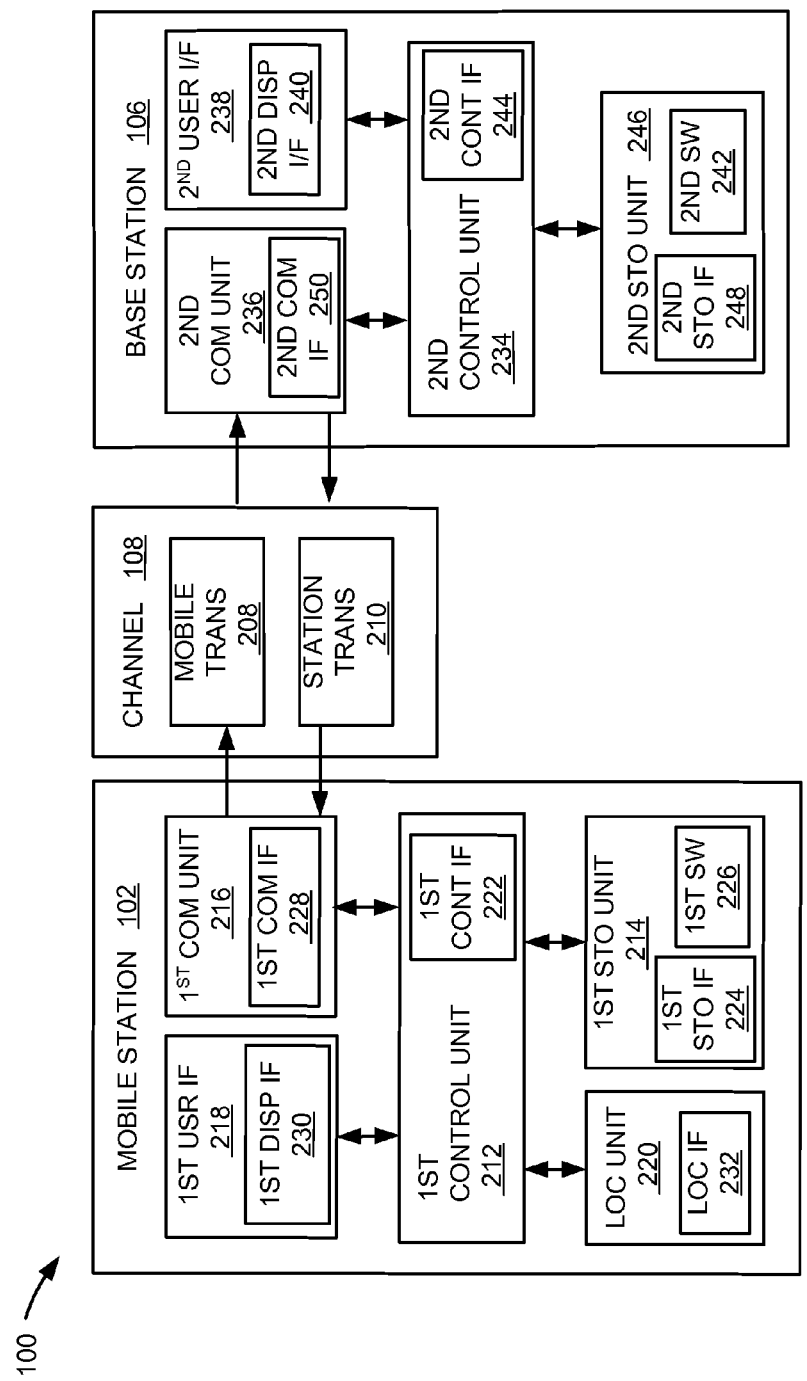
FIG. 2 is an exemplary block diagram of the communication system.

Referring now to FIG. 2, therein is shown an exemplary block diagram of the communication system 100. The communication system 100 can include the mobile station 102, the channel 108, and the base station 106. The mobile station 102 can communicate with anything within the network 104 of FIG. 1, such as the base station 106 or other users, over the channel 108.

For illustrative purposes, the communication system 100 will be described as having the mobile station 102 interacting with the base station 106 through the channel 108. It is understood that the mobile station 102 can communicate with other stations in the network 104 of FIG. 1 and with other components in the network 104.

For example, the mobile station 102 can communicate with multiple base stations for handovers. Also, for example, the mobile station 102 can communicate with cellular phones in other areas through the base station 106 and the network 104.

The mobile station 102 can send information in a mobile transmission 208 over the channel 108 to the base station 106. The base station 106 can send information in a station transmission 210 over the channel 108 to the mobile station 102.

For brevity of description in this embodiment of the present invention, the mobile station 102 will be described as a client device and the base station 106 will be described as communication base station having a communications tower. The present invention is not limited to this selection for the type of devices. The selection is an example of the present invention.

The mobile station 102 can include a first control unit 212, a first storage unit 214, a first communication unit 216, a first user interface 218, and a location unit 220. The first control unit 212 can include a first control interface 222. The first storage unit 214 can include a first storage interface 224.

The first control unit 212 can execute a first software 226 to provide the intelligence of the communication system 100. The first control unit 212 can operate the first user interface 218 to display information generated by the communication system 100. The first control unit 212 can also execute the first software 226 for the other functions of the communication system 100, including receiving location information from the location unit 220. The first control unit 212 can further execute the first software 226 for interaction with the channel 108 of FIG. 1 via the first communication unit 216.

The first control unit 212 can be implemented in a number of different manners. For example, the first control unit 212 can be a processor, an embedded processor, a microprocessor, a hardware control logic, a hardware finite state machine, a digital signal processor, or a combination thereof.

The first control unit 212 can include the first control interface 222. The first control interface 222 can be used for communication between the first control unit 212 and other functional units in the mobile station 102. The first control interface 222 can also be used for communication that is external to the mobile station 102.

The first control interface 222 can receive information from the other functional units or from external sources, or can transmit information to the other functional units or to external destinations. The external sources and the external destinations refer to sources and destinations external to the mobile station 102.

The first control interface 222 can be implemented in different ways and can include different implementations depending on which functional units or external units are being interfaced with the first control interface 222. For example, the first control interface 222 can be implemented with a pressure sensor, an inertial sensor, a microelectromechanical system, optical circuitry, waveguides, wireless circuitry, wireline circuitry, or a combination thereof.

The first storage unit 214 can store the first software 226. The first storage unit 214 can also store the relevant information, such as advertisements, points of interest, navigation routing entries, or any combination thereof.

The first storage unit 214 can be a volatile memory, a nonvolatile memory, an internal memory, an external memory, or a combination thereof. For example, the first storage unit 214 can be a nonvolatile storage such as nonvolatile random access memory, Flash memory, disk storage, or a volatile storage such as static random access memory.

The first storage unit 214 can include the first storage interface 224. The first storage interface 224 can be used for communication between the location unit 220 and other functional units in the mobile station 102. The first storage interface 224 can also be used for communication that is external to the mobile station 102.

The first storage interface 224 can receive information from the other functional units or from external sources, or can transmit information to the other functional units or to external destinations. The external sources and the external destinations refer to sources and destinations external to the mobile station 102.

The first storage interface 224 can include different implementations depending on which functional units or external units are being interfaced with the first storage unit 214. The first storage interface 224 can be implemented with technologies and techniques similar to the implementation of the first control interface 222.

The first communication unit 216 can enable external communication to and from the mobile station 102. For example, the first communication unit 216 can permit the mobile station 102 to communicate with the base station 106, an attachment, such as a peripheral device or a computer desktop, and the channel 108.

The first communication unit 216 can also function as a communication hub allowing the mobile station 102 to function as part of the channel 108 and not limited to be an end point or terminal unit to the channel 108. The first communication unit 216 can include active and passive components, such as microelectronics or an antenna, for interaction with the channel 108.

The first communication unit 216 can include a first communication interface 228. The first communication interface 228 can be used for communication between the first communication unit 216 and other functional units in the mobile station 102. The first communication interface 228 can receive information from the other functional units or can transmit information to the other functional units.

The first communication interface 228 can include different implementations depending on which functional units are being interfaced with the first communication unit 216. The first communication interface 228 can be implemented with technologies and techniques similar to the implementation of the first control interface 222.

The first user interface 218 allows a user to interface and interact with the mobile station 102. The first user interface 218 can include an input device and an output device. Examples of the input device of the first user interface 218 can include a keypad, a touchpad, soft-keys, a keyboard, a microphone, or any combination thereof to provide data and communication inputs.

The first user interface 218 can include a first display interface 230. Examples of the output device of the first user interface 218 can include the first display interface 230. The first display interface 230 can include a display, a projector, a video screen, a speaker, or any combination thereof.

The location unit 220 can generate location information, current heading, current acceleration, and current speed of the mobile station 102, as examples. The location unit 220 can be implemented in many ways. For example, the location unit 220 can function as at least a part of GPS, an inertial navigation system, a cellular-tower location system, a pressure location system, or any combination thereof. Also, for example, the location unit 220 can utilize components such as an accelerometer or GPS receiver.

The location unit 220 can include a location interface 232. The location interface 232 can be used for communication between the location unit 220 and other functional units in the mobile station 102. The location interface 232 can also be used for communication that is external to the mobile station 102.

The location interface 232 can receive information from the other functional units or from external sources, or can transmit information to the other functional units or to external destinations. The external sources and the external destinations refer to sources and destinations external to the mobile station 102.

The location interface 232 can include different implementations depending on which functional units or external units are being interfaced with the location unit 220. The location interface 232 can be implemented with technologies and techniques similar to the implementation of the first control unit 212.

For illustrative purposes, the mobile station 102 is shown with the partition having the first control unit 212, the first storage unit 214, the first user interface 218, the first communication unit 216, and the location unit 220 although it is understood that the communication system 100 can have a different partition. For example, the first software 226 can be partitioned differently such that some or all of its function can be in the first control unit 212, the location unit 220, and the first communication unit 216. Also, the mobile station 102 can include other functional units not shown in FIG. 2 for clarity.

The functional units in the mobile station 102 can work individually and independently of the other functional units. The mobile station 102 can work individually and independently from the base station 106 and the channel 108.

The base station 106 can be optimized for implementing the present invention in a multiple device embodiment with the mobile station 102. The base station 106 can provide the additional or higher performance processing power compared to the mobile station 102. The base station 106 can include a second control unit 234, a second communication unit 236, and a second user interface 238.

The second user interface 238 allows a user to interface and interact with the base station 106. The second user interface 238 can include an input device and an output device. Examples of the input device of the second user interface 238 can include a keypad, a touchpad, soft-keys, a keyboard, a microphone, or any combination thereof to provide data and communication inputs. Examples of the output device of the second user interface 238 can include a second display interface 240. The second display interface 240 can include a display, a projector, a video screen, a speaker, or any combination thereof.

The second control unit 234 can execute a second software 242 to provide the intelligence of the base station 106 of the communication system 100. The second software 242 can operate in conjunction with the first software 226. The second control unit 234 can provide additional performance compared to the first control unit 212.

The second control unit 234 can operate the second user interface 238 to display information. The second control unit 234 can also execute the second software 242 for the other functions of the communication system 100, including operating the second communication unit 236 to communicate with the mobile station 102 over the channel 108.

The second control unit 234 can be implemented in a number of different manners. For example, the second control unit 234 can be a processor, an embedded processor, a microprocessor, a hardware control logic, a hardware finite state machine, a digital signal processor, or a combination thereof.

The second control unit 234 can include a second controller interface 244. The second controller interface 244 can be used for communication between the second control unit 234 and other functional units in the base station 106. The second controller interface 244 can also be used for communication that is external to the base station 106.

The second controller interface 244 can receive information from the other functional units or from external sources, or can transmit information to the other functional units or to external destinations. The external sources and the external destinations refer to sources and destinations external to the base station 106.

The second controller interface 244 can be implemented in different ways and can include different implementations depending on which functional units or external units are being interfaced with the second controller interface 244. For example, the second controller interface 244 can be implemented with a pressure sensor, an inertial sensor, a microelectromechanical system, optical circuitry, waveguides, wireless circuitry, wireline circuitry, or a combination thereof.

A second storage unit 246 can store the second software 242. The second storage unit 246 can also store the relevant information, such as phone numbers, identification information, information for multiple access, such as code, frequency, or time slot, advertisements, points of interest, navigation routing entries, or any combination thereof. The second storage unit 246 can be sized to provide the additional storage capacity to supplement the first storage unit 214.

For illustrative purposes, the second storage unit 246 is shown as a single element, although it is understood that the second storage unit 246 can be a distribution of storage elements. Also for illustrative purposes, the communication system 100 is shown with the second storage unit 246 as a single hierarchy storage system, although it is understood that the communication system 100 can have the second storage unit 246 in a different configuration. For example, the second storage unit 246 can be formed with different storage technologies forming a memory hierarchical system including different levels of caching, main memory, rotating media, or off-line storage.

The second storage unit 246 can be a volatile memory, a nonvolatile memory, an internal memory, an external memory, or a combination thereof. For example, the second storage unit 246 can be a nonvolatile storage such as nonvolatile random access memory, Flash memory, disk storage, or a volatile storage such as static random access memory.

The second storage unit 246 can include a second storage interface 248. The second storage interface 248 can be used for communication between the location unit 220 and other functional units in the base station 106. The second storage interface 248 can also be used for communication that is external to the base station 106.

The second storage interface 248 can receive information from the other functional units or from external sources, or can transmit information to the other functional units or to external destinations. The external sources and the external destinations refer to sources and destinations external to the base station 106.

The second storage interface 248 can include different implementations depending on which functional units or external units are being interfaced with the second storage unit 246. The second storage interface 248 can be implemented with technologies and techniques similar to the implementation of the second controller interface 244.

The second communication unit 236 can enable external communication to and from the base station 106. For example, the second communication unit 236 can permit the base station 106 to communicate with the mobile station 102 over the channel 108.

The second communication unit 236 can also function as a communication hub allowing the base station 106 to function as part of the channel 108 and not limited to be an end point or terminal unit to the channel 108. The second communication unit 236 can include active and passive components, such as microelectronics or an antenna, for interaction with the channel 108.

The second communication unit 236 can include a second communication interface 250. The second communication interface 250 can be used for communication between the second communication unit 236 and other functional units in the base station 106. The second communication interface 250 can receive information from the other functional units or can transmit information to the other functional units.

The second communication interface 250 can include different implementations depending on which functional units are being interfaced with the second communication unit 236. The second communication interface 250 can be implemented with technologies and techniques similar to the implementation of the second controller interface 244.

The first communication unit 216 can couple with the channel 108 to send information to the base station 106 in the mobile transmission 208. The base station 106 can receive information in the second communication unit 236 from the mobile transmission 208 of the channel 108.

The second communication unit 236 can couple with the channel 108 to send information to the mobile station 102 in the station transmission 210. The mobile station 102 can receive information in the first communication unit 216 from the station transmission 210 of the channel 108. The communication system 100 can be executed by the first control unit 212, the second control unit 234, or a combination thereof.

For illustrative purposes, the base station 106 is shown with the partition having the second user interface 238, the second storage unit 246, the second control unit 234, and the second communication unit 236, although it is understood that the base station 106 can have a different partition. For example, the second software 242 can be partitioned differently such that some or all of its function can be in the second control unit 234 and the second communication unit 236. Also, the base station 106 can include other functional units not shown in FIG. 2 for clarity.

The functional units in the base station 106 can work individually and independently of the other functional units. The base station 106 can work individually and independently from the mobile station 102 and the channel 108.

For illustrative purposes, the communication system 100 is described by operation of the mobile station 102 and the base station 106. It is understood that the mobile station 102 and the base station 106 can operate any of the modules and functions of the communication system 100. For example, the mobile station 102 is described to operate the location unit 220, although it is understood that the base station 106 can also operate the location unit 220.

Figure 3:
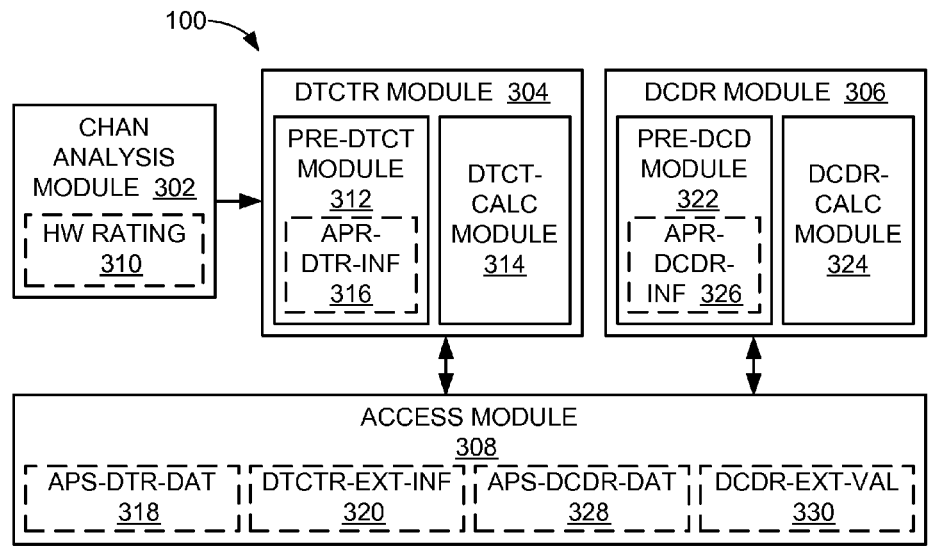
FIG. 3 is a functional block diagram of the communication system in a first embodiment.

Referring now to FIG. 3, therein is shown a functional block diagram of the communication system 100 in a first embodiment. The communication system 100 can have a channel analysis module 302, a detector module 304, a decoder module 306, and an access module 308. The channel analysis module 302 can be coupled to the detector module 304, which can be coupled to the access module 308. The decoder module 306 can also be coupled to the access module 308.

For illustrative purposes, the communication system 100 is shown having one module for detection and one module for decoding. However, it is understood that the communication system 100 can have multiple modules individually detecting or each decoding the received signal 116 of FIG. 1 or portions thereof. The communication system 100 can also have multiple modules sharing the detection or decoding process for the received signal 116 of FIG. 1 or portions thereof.

The channel analysis module 302 is for characterizing the behavior of a signal travelling through the channel 108 of FIG. 1. The channel analysis module 302 can characterize the channel 108 by calculating the distortion 118 of FIG. 1.

The channel analysis module 302 can calculate the distortion 118 by analyzing the reference signal portion within the received signal 116. The channel analysis module 302 can calculate the difference, such as amplitude, phase, frequency, signal shape, power, or a combination thereof between a known reference signal and the reference signal portion of the received signal 116.

The channel analysis module 302 can further characterize the channel 108 by selecting a model for the channel 108 according to the distortion 118. The communication system 100 can have a selection of models for the channel 108, such as urban city or flat fading. The models and the corresponding values of the distortion 118 can be predetermined by the communication system 100, the hardware manufacturer, the software manufacturer, or a combination thereof.

The channel analysis module 302 can also characterize the channel by calculating the signal-to-noise ratio (SNR) of the received signal 116. The channel analysis module 302 can calculate the SNR by first separating the signal portion from the received signal 116. The channel analysis module 302 can then calculate the power within the both the signal portion and the remaining portions of the received signal. The channel analysis module 302 can calculate the SNR by calculating the ratio between the power of the signal portion of the received signal 116 and power of the remaining portion of the received signal 116.

The communication system 100 can have a hardware rating 310 associated with the channel analysis module 302, the detector module 304, the decoder module 306, the access module 308, or a combination thereof. The hardware rating 310 can be a measure of accuracy associated with the corresponding hardware portion. For example, the hardware rating 310 can be the number of bits used for calculations or sampling or the error tolerance inherent to the hardware components.

For illustrative purposes, the hardware rating 310 will be shown within the channel analysis module 302. However, it is understood that the hardware rating 310 can be a measure for each of the modules in the communication system. Also, it is understood that the hardware rating 310 can refer to the accuracy of the individual modules, the collection of the modules, or a combination thereof.

The channel analysis module 302 can use the first communication unit 216 of FIG. 2, the first control unit 212 of FIG. 2, or a combination thereof to characterize the channel 108. The channel analysis module 302 can store the results of the characterization in the first storage unit 214 of FIG. 2. The channel analysis module 302 can also pass the received signal 116, the channel characterization, including the distortion 118 and other information to the detector module 304.

The detector module 304 is for analyzing the individual symbols within the received signal 116. The detector module 304 can analyze the symbols in the layers or subcarriers. For example, the detector module 304 can analyze the individual symbols using the received signal 116 received through each of the antennas in MIMO communication, represented by the information in the main layer 112 of FIG. 1 and the separate layer 114 of FIG. 1.

The detector module 304 can use various implementations. For example, the detector module 304 can be a maximum-likelihood detector, a linear estimator, such as a minimum mean square error estimator or a zero-forcing estimator, or an interference cancelling detector. The detector module 304 can be a non-interference cancelling detector, such that detection of the main layer 112 of FIG. 1 can be done along with the separate layer 114 of FIG. 1, without cancelling the separate layer 114.

The detector module 304 can analyze the received signal 116 with respect to the symbols regardless of the coding method or the code word 122 of FIG. 1 corresponding to the analyzed symbol. The detector module 304 can analyze one symbol at a time, which can correspond to two to six bits of information, depending on the modulation scheme.

The detector module 304 can have a pre-detection module 312 and a detector-calculation module 314. The detector module 304 can analyze the received signal 116 by processing an a-priori detector-information 316, an a-posteriori detector-data 318, and a detector-extrinsic-information 320 using the pre-detection module 312 and the detector-calculation module 314.

The detector module 304 can use the pre-detection module 312 to analyze the received signal 116. The pre-detection module 312 is for determining the a-priori detector-information 316 from the a-posteriori detector-data 318, the detector-extrinsic-information 320, results from the decoder module 306, or a combination thereof passed from or stored in the access module 308.

The pre-detection module 312 can determine the a-priori detector-information 316 by determining the value passed from the access module 308 as the a-priori detector-information 316. The details regarding the access module 308 will be discussed below. The pre-detection module 312 can also determine the a-priori detector-information 316 by initializing the a-priori detector-information 316 to the predetermined value during initialization, reset, or handover situations as discussed above.

The detector module 304 can also use the detector-calculation module 314 to analyze the received signal 116 by estimating a likely transmitted symbol in the transmitted signal 110 of FIG. 1 corresponding to the analyzed symbol in the received signal 116. The detector-calculation module 314 is for calculating and adjusting the a-posteriori detector-data 318, the detector-extrinsic-information 320, or a combination thereof using the a-priori detector-information 316.

The a-priori detector-information 316 is defined as a prior knowledge for the detector module 304 about the transmitted signal 110, the received signal 116, the symbols or bits therein, or a combination thereof. The a-priori detector-information 316 can be set to a last-calculated result from the detector module 304, the decoder module 306, or a combination thereof. The a-priori detector-information 316 can be expressed as:

$$L_a(b_k) \stackrel{def}{=} \frac{p(b_k = +1)}{p(b_k = -1)} \quad \text{Eq. (1)}$$

Portions of the transmitted or received signals can be expressed using k, which can be an index parameter corresponding to a particular bit within the code word 122 in a sequential transmission within the transmitted signal 110, the received signal 116, or a combination thereof. Further, b can indicate a bit. The probability of that a certain bit b at k is +1 can be expressed as $p(b_k=+1)$ and the probability of the same bit being −1 can be expressed as $p(b_k=-1)$.

The a-priori detector-information 316 can be initialized when the communication system 100 is initialized, reset, or performs a handover operation. The a-priori detector-information 316 can be initialized to zero, a value predetermined by the communication system 100, the hardware manufacturer, the software manufacturer, or a combination thereof.

The a-posteriori detector-data 318 is defined as a later knowledge for the detector module 304 about the transmitted signal 110, the received signal 116, the symbols therein, or a combination thereof. The a-posteriori detector-data 318 can be a measure of confidence level associated with the likely transmitted symbol in the transmitted signal 110 corresponding to the analyzed symbol in the received signal 116.

The a-posteriori detector-data 318 can also be a set of confidence levels associated with each of the symbols within the modulation scheme. The a-posteriori detector-data 318 can represent the percentage likelihoods that the analyzed symbol in the received signal 116 matches each of the symbols available in the modulation scheme. The a-posteriori detector-data 318 can be a log likelihood ratio (LLR), which can represent an initial bit value of zero.

The a-posteriori detector-data 318 can be a value calculated by the detector-calculation module 314 of the detector module 304. The detector-calculation module 314 can calculate the a-posteriori detector-data 318, expressed as $L_A(b)$, according to:

$$L_A(b_k) = \log\frac{p(b_k = +1 \mid y)}{p(b_k = -1 \mid y)} = \log\frac{\sum_{x:b_k=+1} p(y \mid x)p(x)}{\sum_{x:b_k=-1} p(y \mid x)p(x)}. \quad \text{Eq. (2)}$$

The LLR of the a-posteriori detector-data 318 can account for the received signal 116 or a derivation of the received signal 116, expressed as y, and the transmitted signal 110, expressed as x.

The detector-calculation module 314 can use the first control interface 222 of FIG. 2, the first storage interface 224 of FIG. 2, or a combination thereof to access the first storage unit 214. The detector-calculation module 314 can store the results of the calculations, including the a-priori detector-information 316 and the a-posteriori detector-data 318, in the first storage unit 214.

The detector-calculation module 314 can further use the first control unit 212, first communication unit 216, or a combination thereof to calculate the detector-extrinsic-information 320. The detector-extrinsic-information 320 is defined as new information that is not derived from information input to the detector module 304. The detector-extrinsic-information 320 can represent an error, an improvement, or a different between the previously calculated value and the current calculation.

The detector-calculation module 314 can calculate the detector-extrinsic-information 320 by taking the difference between the a-posteriori detector-data 318 and the a-priori detector-information 316. The detector-extrinsic-information 320 can be expressed as:

$$L_E(b_k) \approx \max_{x:b_k=+1}\left(-\frac{1}{\sigma^2}\|y - Hx\|^2 + \frac{1}{2}b(x_{[k]})^T L_{A,[k]}\right) - \max_{x:b_k=-1}\left(-\frac{1}{\sigma^2}\|y - Hx\|^2 + \frac{1}{2}b(x_{[k]})^T L_{A,[k]}\right). \quad \text{Eq. (3)}$$

The detector-extrinsic-information 320 can be estimated by accounting for the characteristics of the channel 108, such as the distortion 118, which can be expressed as H. For example, H can be the MIMO channel estimate. The $\sigma^2$ can represent the noise variance within the received signal 116 y.

The detector module 304 can pass the detector-extrinsic-information 320, the a-posteriori detector-data 318, or both to the access module 308. The detector module 304 can also store the detector-extrinsic-information 320, the a-posteriori detector-data 318, or both in the first storage unit 214. The detector module 304 can access the detector-extrinsic-information 320, the a-posteriori detector-data 318, or both calculated during a previous iteration through the access module 308, the first storage unit 214, or a combination thereof.

The access module 308 can access the detector-extrinsic-information 320, the a-posteriori detector-data 318, or both by receiving the data and by the storing the detector-extrinsic-information 320, the a-posteriori detector-data 318, or both in the first storage unit 214. When the communication system 100 includes multiple instances of detection modules, the access module 308 can store the detector-extrinsic-information 320, the a-posteriori detector-data 318, similar corresponding values for each of the modules, or a combination thereof according to the module calculating the values. Details regarding the access module 308 will be discussed below.

The decoder module 306 can also pass the calculated values to the access module 308. The decoder module 306 is for analyzing the received signal 116 at a bit level, without analyzing symbol level information. The decoder module 306 can analyze at a bit level by combining and analyzing the outputs of the detector module 304. The decoder module 306 can combine the symbol level information of the detector module 304 into estimates of the code words originally contained in the transmitted signal 110.

The decoder module 306 can analyze the received signal 116 by decoding the transmitted signal 110.

The decoder module 306 can decode the transmitted signal 110 and the information contained in the code words using a pre-decoding module 322 and a decoder-calculation module 324. The decoder module 306 can extract the information intended for communication before coding for transmission by decoding the information contained in the code words. The decoder module 306 can decode by processing an a-priori-decoder-information 326, an a-posteriori-decoder-data 328, and a decoder-extrinsic-value 330 using the pre-decoding module 322 and the decoder-calculation module 324.

The pre-decoding module 322 is for determining the a-priori-decoder-information 326 from the detector-extrinsic-information 320, the a-posteriori detector-data 318, the decoder-extrinsic-value 330, the a-posteriori-decoder-data 328, or a combination thereof passed from or stored in the access module 308. The pre-decoding module 322 can determine the a-priori-decoder-information 326 by determining the value passed from the access module 308 as the a-priori-decoder-information 326.

The pre-decoding module 322 can also determine the a-priori detector-information 316 by initializing the a-priori-decoder-information 326 to the predetermined value during initialization, reset, or handover situations. For example, when the system is initialized, reset, or performs the handover process, the pre-decoding module 322 can initialize the a-priori-decoder-information 326 to zero or a value predetermined by the communication system 100, the software manufacturer, the hardware manufacturer, or a combination thereof.

The a-priori-decoder-information 326 is defined as a prior knowledge for the decoder module 306 about the transmitted signal 110, the received signal 116, the symbols or bits therein, or a combination thereof. The a-priori-decoder-information 326 can be the last-calculated result from the detector module 304, the decoder module 306, or a combination thereof. The a-priori-decoder-information 326 can be similar to the a-priori detector-information 316 in relation to the detector module 304, and also be expressed using equation (1).

The decoder-calculation module 324 is for adjusting the a-posteriori-decoder-data 328, the decoder-extrinsic-value 330, or a combination thereof using the a-priori-decoder-information 326. The a-posteriori-decoder-data 328 is defined as a later knowledge for the decoder module 306 about the transmitted signal 110, the received signal 116, the bits therein, or a combination thereof. The a-posteriori-decoder-data 328 can be a measure of confidence level associated with the likely transmitted bit in the transmitted signal 110 corresponding to the bits according to the analyzed symbol in the received signal 116.

The a-posteriori-decoder-data 328 can be the LLR value that a particular transmitted bit, which can represent a transmitted bit value of zero. The decoder-calculation module 324 can calculate the a-posteriori-decoder-data 328 using equation (4).

$$L_{A-DEC}(b_k) = \log \frac{\sum\limits_{x:b_k=+1} p(x)}{\sum\limits_{x:b_k=-1} p(x)}. \qquad \text{Eq. (4)}$$

The decoder-extrinsic-value 330 is defined as new information that is not derived from information input to the decoder module 306. The decoder-calculation module 324 can use the first control unit 212, first communication unit 216, or a combination thereof to calculate the decoder-extrinsic-value 330. The decoder-extrinsic-value 330 can represent an error, an improvement, or a different between the previously calculated value and the current calculation.

The decoder-extrinsic-value 330 can be similar to the detector-extrinsic-information 320. The decoder-calculation module 324 can calculate the decoder-extrinsic-value 330 by taking the difference between the a-priori-decoder-information 326 and the a-posteriori-decoder-data 328.

The decoder-calculation module 324 can store the decoder-extrinsic-value 330, the a-posteriori-decoder-data 328, or a combination thereof. The decoder module 306 can also pass the decoder-extrinsic-value 330, the a-posteriori-decoder-data 328, or a combination thereof to the access module 308.

The access module 308 is for controlling the input to and output from the detector module 304 and the decoder module 306 for each iteration. The access module 308 can control the input and output by controlling the order of execution or performing bus control using the inputs, along with storing the outputs from each iteration.

The access module 308 can control the order of execution using a predetermined order, a condition, a limit on the number of execution, or a combination thereof for executing the calculations of the detector module 304, the decoder module 306, or a combination thereof. The order, condition, limit for executing the modules can be predetermined by the communication system 100, the software manufacturer, the hardware manufacturer, or a combination thereof.

The access module 308 can pass the input to the detector module 304 or the decoder module 306 according to the predetermined order. The access module 308 can wait for the detector module 304 or the decoder module 306 to output a result before executing the next module. The input values can also be similar to a token for executing the calculations of the module, and the output values can be transferred back to the access module 308 for marking the end of the calculation.

For example, the access module 308 can be a central control device that dictates the order of execution for the modules using the input to the modules. Also, for example, the communication system 100 can have a shared bus architecture where the access module 308 controls the bus using the input and output values as token for executing the modules.

The access module 308 can retain the detector-extrinsic-information 320, the a-posteriori detector-data 318, the decoder-extrinsic-value 330, the a-posteriori-decoder-data 328, or a combination thereof from previous iteration. The access module 308 can further retain information as to which module was last to calculate the results and pass the values to the access module 308.

The access module 308 can pass the detector-extrinsic-information 320, the a-posteriori detector-data 318, the decoder-extrinsic-value 330, the a-posteriori-decoder-data 328, or a combination thereof corresponding to the last-received values to the next executing module. The next executing module, such as the pre-detection module 312 or the pre-decoding module 322 can use the passed information as the a priori value.

For example, the pre-detection module 312 can determine the a-priori detector-information 316 from the detector-extrinsic-information 320, the a-posteriori detector-data 318, the decoder-extrinsic-value 330, the a-posteriori-decoder-data 328, or a combination thereof passed from or stored in the access module 308. Also, for example, the pre-decoding module 322 can determine the a-priori-decoder-information 326 from the detector-extrinsic-information 320, the a-posteriori detector-data 318, the decoder-extrinsic-value 330, the a-posteriori-decoder-data 328, or a combination thereof passed from or stored in the access module 308.

For example, the access module 308 can have the order of execution as the detector module 304 executing twice with each execution targeting a different instance of the code word 122, followed by executions of the decoder module 306 for 10 executions. The channel analysis module 302 can pass the channel characteristics and the received signal 116 to the detector module 304. The access module 308 can also have the detector module 304 start by passing an initial value of zero to the detector module 304.

Continuing with the example, the pre-detection module 312 can determine the a-priori detector-information 316. The detector-calculation module 314 can calculate the detector-extrinsic-information 320 and the a-posteriori detector-data 318 using initialized values or the output values of the channel analysis module 302. The detector module 304 can pass the detector-extrinsic-information 320, the a-posteriori detector-data 318 or a combination thereof to the access module 308.

Continuing with the example, the access module 308 can pass the detector-extrinsic-information 320, the a-posteriori detector-data 318 or a combination thereof back to the detector module 304. The pre-detection module 312 can set the value of the a-priori detector-information 316 to be the same as the information received from the access module 308.

Continuing with the example, the detector-calculation module 314 can calculate the detector-extrinsic-information 320 and the a-posteriori detector-data 318 using the received values in the a-priori detector-information 316. The detector module 304 can pass the detector-extrinsic-information 320, the a-posteriori detector-data 318, or a combination thereof to the access module 308.

Continuing with the example, the access module 308 can pass the detector-extrinsic-information 320, the a-posteriori detector-data 318 or a combination thereof to the decoder module 306. The pre-decoding module 322 can determine the value of the a-priori-decoder-information 326 to be the same as the information received from the access module 308.

Continuing with the example, the decoder-calculation module 324 can calculate the a-posteriori-decoder-data 328 and the decoder-extrinsic-value 330 using the received values in the a-priori-decoder-information 326. The decoder module 306 can pass the a-posteriori-decoder-data 328, the decoder-extrinsic-value 330, or a combination thereof to the access module 308.

Continuing with the example, the access module 308 can pass the information from the decoder module 306 back to the decoder module 306. The pre-decoding module 322 can set the a-priori-decoder-information 326 equal to the information passed from the access module 308 and repeat the calculations. The interaction between the access module 308 and the decoder module 306 can repeat until conditions, limits, execution limit, or a combination thereof predetermined by communication system 100, the software manufacturer, the hardware manufacturer, or a combination thereof is satisfied.

The access module 308 can also use scale factors. The access module 308 can scale the detector-extrinsic-information 320, the a-posteriori detector-data 318, the decoder-extrinsic-value 330, the a-posteriori-decoder-data 328, or a combination thereof according to the hardware rating 310. The scale factors can be used to adjust the over-optimistic LLR as a result of using suboptimal detector and decoder.

The access module 308 can access the hardware rating 310 using the first communication interface 228 of FIG. 2, the first control interface 222, the first storage interface 224, or a combination thereof. The access module 308 can use predetermined method, equation, look-up table, or a combination thereof stored in the first storage unit 214 to determine the scale factor. The method, equation, look-up table, or a combination thereof can be predetermined by the communication system 100, the hardware manufacturer, the software manufacturer, or a combination thereof.

For illustrative purposes, the channel analysis module 302 is described as determining the hardware rating 310 and the access module 308 is described as scaling the results of the modules. However, it is understood that the detector module 304, the decoder module 306, or a combination thereof can determine the hardware rating 310, scale the calculated results, or both.

Further, for illustrative purposes, the access module 308 is described as controlling the execution of the detector module 304 and the decoder module 306. However, it is understood that the detector module 304, the decoder module 306, or a combination thereof can dictate the execution of the modules. Further, the detector module 304 and the decoder module 306 can be coupled to control the execution order.

Also, for illustrative purposes, only one of the detector module 304, the decoder module 306, and the access module 308 are described as executing each time while the other modules remain inactive. However, it is understood that parallel processing is available, where more than one of the modules can execute simultaneously. For example, a combination of the detector module 304, the decoder module 306, and the access module 308 can simultaneously process multiple bits, code words, symbols, or a combination thereof.

It has been discovered that the access module 308 having the detector-extrinsic-information 320, the a-posteriori detector-data 318, the a-posteriori-decoder-data 328, the decoder-extrinsic-value 330, or a combination thereof provides flexibility in execution order, reduced run-time, and accuracy. The combination of the access module 308 and the detector-extrinsic-information 320, the a-posteriori detector-data 318, the a-posteriori-decoder-data 328, the decoder-extrinsic-value 330, or a combination thereof can provide the improvements by allowing all modules to access the previous outputs regardless of which module perform the previous calculation.

Figure 4:
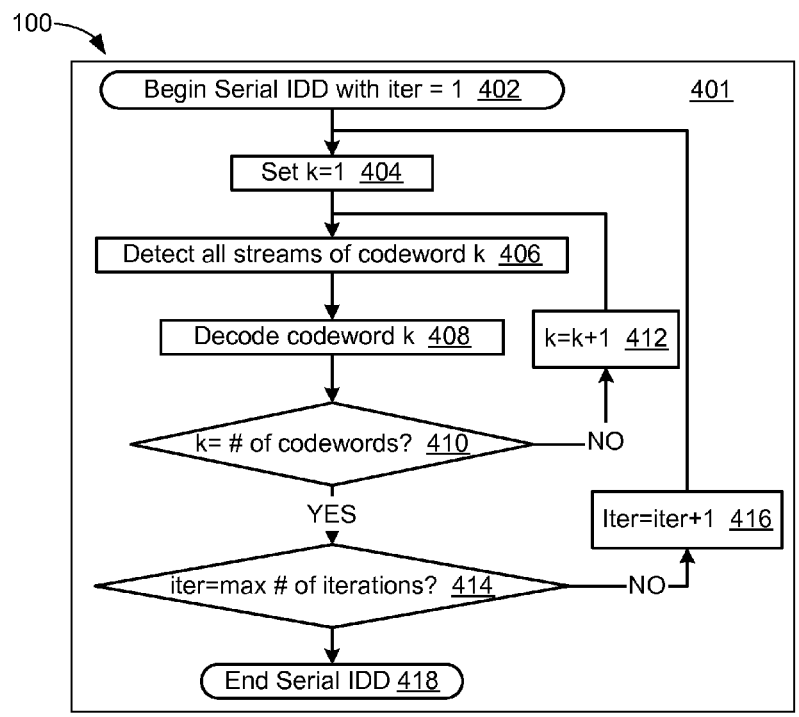
FIG. 4 is an example of the control flow of the communication system in the first embodiment.

Referring now to FIG. 4, therein is shown an example of the control flow of the communication system 100 in the first embodiment. The example control flow can show the overall interactions of the modules of FIG. 3 using an exemplary scenario for the communication system 100.

The communication system 100 can process the received signal 116 of FIG. 1 in a serial configuration 401. The serial configuration 401 is defined as detecting all symbols of the code word 122, decoding the code word 122, using the decoding information to detect all symbols of a different instance of the code word 122, and decode the different instance of the code word 122. This process continues until each instance of the code word 122 within the received signal 116 is detected and decoded once. Then the next iteration starts and each instance of the code word 122 undergo detection and decoding again. In comparison, a parallel configuration can be detecting all symbols of all instances of the code words within the received signal 116 or a portion thereof before the decoding process.

The communication system 100 can use a non-interference cancelling type of detector for the detector module 304 of FIG. 3, such as maximum likelihood or zero-forcing detector. The communication system 100 can detect and decode one symbol at a time with the non-interference cancelling type of detector.

For example, the communication system 100 can detect and decode one symbol at a time by calculating all possibilities corresponding to all of the symbols in the constellation and all possible bit combinations for all available encoding methods. The communication system 100 can detect and decode the symbol within the received signal 116 without calculating the mean of the possibilities, simplifying the layer information, or a combination thereof.

The communication system 100 can have an iteration counter, a code index, a maximum code word count, and a maximum iteration. The iteration counter can be a number representing the number of executions. The code index can be a number representing the order or identifier for indicating the code word 122 of FIG. 1 in the received signal 116 that the communication system 100 is currently analyzing. The code index can be represented by k.

The maximum code word count can be the number of code words that the communication system 100 can analyze during each iteration before the process resets. The maximum code word count can be used as an upper limit for the number of executions by the communication system 100. The maximum iteration can be the upper limit for the number of executions overall by the communication system 100. The maximum code word count can be the number of code words spatially multiplexed together to be jointly detected and decoded.

The communication system 100 can set the iteration count to 1 and begin the iterative-detector-decoder (IDD) according to the serial configuration 401 in a serial-IDD start block 402. The access module 308 of FIG. 3 can set the iteration count.

The communication system 100 can also set the code index to 1 in a code-index initialization block 404. The access module 308 can set the code index value to 1.

The communication system 100 can detect all streams of the code word 122 at the code index in a code detection block 406. The access module 308 can execute the detector module 304 to detect all symbols for all layers for the code word 122 at the code index within the received signal 116. The access module 308 and the detector module 304 can use the previous results of the detector module 304 as described above.

The communication system 100 can decode the code word 122 at code index in a code decoding block 408. The access module 308 can execute the decoder module 306 of FIG. 3 to decode all of the symbols detected by the detector module 304. The decoder module 306 can use the outputs of the decoder module 306 itself, the detector module 304, or a combination thereof to decode the symbols as described above.

The communication system 100 can determine whether the code index is equal to the maximum word count in a code-index evaluation block 410. The communication system 100 can have the access module 308 compare the code index to the maximum code word count.

The access module 308 can increment the code index up by 1 in a code-index increment block 412 when the code index is less than the maximum word count. The access module 308 can also re-execute the steps in the code detection block 406 and the code decoding block 408. The access module 308 can repeat the steps and comparison until the code index is equal to the maximum code word count.

When the code index is equal to the maximum code word count, the access module 308 can evaluate whether the iteration count is equal to the maximum iteration in an iteration evaluation block 414. When the iteration count is less than the maximum iteration, the access module 308 can increment the iteration count up by 1 in an iteration increment block 416 and repeat the steps from the code-index initialization block 404 to the code-index evaluation block 410 as described above.

The access module 308 can repeat the steps until the iteration count is equal to the maximum iteration. When the iteration count is equal to the maximum iteration, the access module 308 can end the serial IDD in an end loop block 418.

It has been discovered that the access module 308 having the serial configuration 401 improved execution speed and increases the accuracy of the estimations. The access module 308 having the serial configuration 401 proves the improved error rate performance by analyzing one code word at a time and using the output information from one code word to improve the detection and decoding of the subsequent code word.

Figure 5:
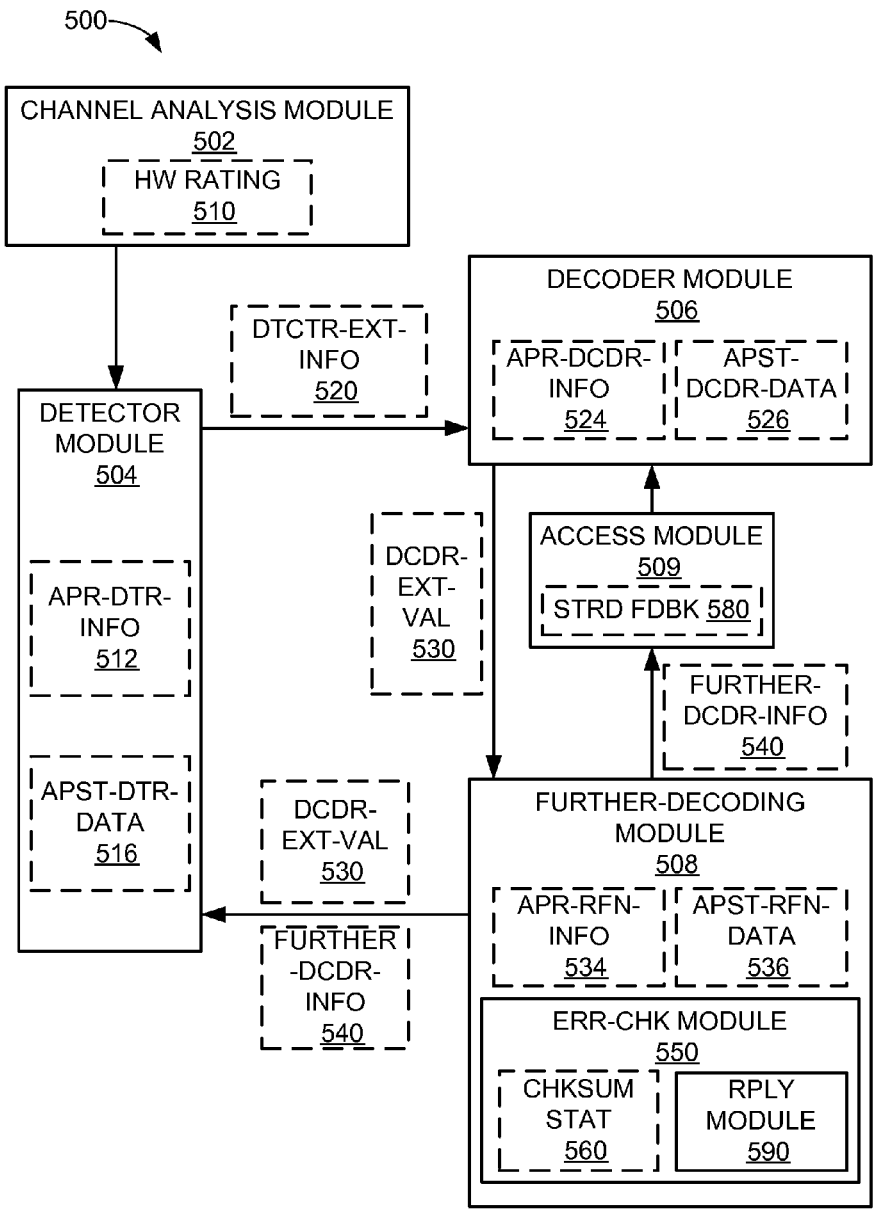
FIG. 5 is a functional block diagram of a communication system in a second embodiment.

Referring now to FIG. 5, therein is shown a functional block diagram of a communication system 500 in a second embodiment. The communication system 500 can be an exemplary embodiment of the communication system 100 of FIG. 3 specific for executing turbo-encoded signals.

The communication system 500 can have the channel analysis module 502, a detector module 504, a decoder module 506, a further-decoding module 508, and an access module 509. The channel analysis module 502 can be coupled to the detector module 504. The detector module 504 can be coupled to the decoder module 506, which can be coupled to the further-decoding module 508. The further-decoding module 508 can also be coupled to the detector module 504. The access module 509 can be coupled to the decoder module 506 and the further-decoding module 508.

The control flow of the communication system 500 in the second embodiment can be used for decoding the transmitted signal 110 of FIG. 1 encoded using a turbo-code. The communication system 100 can decode the received signal 116 of FIG. 1 according to the turbo-coding method using the further-decoding module 508.

The channel analysis module 502 is for characterizing the behavior of a signal travelling through the channel 108 of FIG. 1. The channel analysis module 502 can be similar or equal to the channel analysis module 302 of FIG. 3. The channel analysis module can characterize the channel 108 by calculating the distortion 118 of FIG. 1 using the reference signal portion within the received signal 116, selecting a channel model, calculating the SNR, or a combination thereof.

The communication system 500 can have a hardware rating 510 associated with the channel analysis module 502, the detector module 504, the decoder module 506, the further-decoding module 508, or a combination thereof. The hardware rating 510 can be similar or equal to the hardware rating 310 of FIG. 3.

For illustrative purposes, the hardware rating 510 will be shown within the channel analysis module 502. However, it is understood that the hardware rating 510 can be a measure for each of the modules in the communication system. Also, it is understood that the hardware rating 510 can refer to the accuracy of the individual modules, the collection of the modules, or a combination thereof.

The channel analysis module 502 can pass the characterization of the channel 108, such as the distortion 118 or the channel model, and the received signal 116 to the detector module 504. The detector module 504 is for analyzing the individual symbols within the received signal 116. The detector module 504 can be similar to the detector module 304 of FIG. 3.

The detector module 504 can calculate an a-priori detector-information 512, an a-posteriori detector-data 516, and a detector-extrinsic-information 520. The a-priori detector-information 512 is defined as a prior knowledge for the detector module 504 about the transmitted signal 110, the received signal 116, the symbols or bits therein, or a combination thereof. The a-priori detector-information 512 can be similar to the a-priori detector-information 316 of FIG. 3. The detector module 504 can determine the a-priori detector-information 512 as described for the a-priori detector-information 316 above.

The a-posteriori detector-data 516 is defined as a later knowledge for the detector module 504 about the transmitted signal 110, the received signal 116, the symbols therein, or a combination thereof. The a-posteriori detector-data 516 can be similar to the a-posteriori detector-data 318 of FIG. 3. The detector module 504 can calculate the a-posteriori detector-data 516 as described for the a-posteriori detector-data 318 above.

The detector-extrinsic-information 520 is defined as new information that is not derived from information input to the detector module 504. The detector-extrinsic-information 520 can be similar to the detector-extrinsic-information 320 of FIG. 3. The detector module 504 can calculate the detector-extrinsic-information 520 as described for the detector-extrinsic-information 320 above.

The detector module 504 can pass the detector-extrinsic-information 520 to the decoder module 506. The decoder module 506 is for analyzing the received signal 116 at a bit level, without analyzing symbol level information. The decoder module 506 can be similar to the decoder module 306 of FIG. 3 and analyze a portion of the bits for the code word 122 of FIG. 1. The decoder module 506 can process an a-priori-decoder-information 524, an a-posteriori-decoder-data 526, and a decoder-extrinsic-value 530.

The decoder module 506 can determine the a-priori-decoder-information 524. The a-priori-decoder-information 524 is defined as a prior knowledge for the decoder module 506 about the transmitted signal 110, the received signal 116, the symbols or bits therein, or a combination thereof. The a-priori-decoder-information 524 can be similar to the a-priori-decoder-information 326 of FIG. 3. The decoder module 506 can calculate the a-priori-decoder-information 524 as described for the a-priori-decoder-information 326 above.

The decoder module 506 can decode a portion of the code word. For example, the decoder module 506 can decode the convolutional code consisting of the systematic bits and the first parity bits of the code word 122. The decoder module 506 can decode the portion of the code word 122 by calculating the a-posteriori-decoder-data 526 and the decoder-extrinsic-value 530 corresponding to the portion of the code word 122.

The a-posteriori-decoder-data 526 is defined as a later knowledge for the decoder module 506 about the transmitted signal 110, the received signal 116, the bits therein, or a combination thereof. The a-posteriori-decoder-data 526 can be similar to the a-posteriori-decoder-data 328 of FIG. 3. The decoder module 506 can calculate the a-posteriori-decoder-data 526 as described for the a-posteriori-decoder-data 328 above using the portion of the code word 122. The decoder module 506 can also calculate the a-posteriori-decoder-data 526 to account for the parity bit 124.

The decoder-extrinsic-value 530 is defined as new information that is not derived from information input to the decoder module 506. The decoder-extrinsic-value 530 can be similar to the decoder-extrinsic-value 330 of FIG. 3. The decoder module 506 can calculate the decoder-extrinsic-value 530 as described for decoder-extrinsic-value 330 above in FIG. 3 using the portion of the code word 122. The decoder module 506 can calculate the decoder-extrinsic-value 530 to account for the parity bit 124.

The decoder module 506 can pass the decoder-extrinsic-value 330 to the further-decoding module 508. The further-decoding module 508 is for analyzing the received signal 116 at a bit level, without analyzing symbol level information. The further-decoding module 508 can be similar to the decoder module 506 but analyze a remaining portion of the bits for the code word 122 not analyzed by the decoder module 506. The further-decoding module 508 can process an a-priori-refinement-information 534, an a-posteriori-refinement-data 536, and a further-decoder-information 540.

The further-decoding module 508 can determine the a-priori-refinement-information 534. The a-priori-refinement-information 534 is defined as a prior knowledge for the further-decoding module 508 about the transmitted signal 110, the received signal 116, the symbols or bits therein, or a combination thereof. The a-priori-refinement-information 534 can be similar to the a-priori-decoder-information 524. The further-decoding module 508 can calculate the a-priori-refinement-information 534 as described for the a-priori-decoder-information 524 above.

The further-decoding module 508 can decode the remaining portion of the code word 122 after the turbo-decoding module 506. For example, the further-decoding module 508 can decode the second convolutional code in the code word 122. The further-decoding module 508 can decode the remaining portion by calculating the a-posteriori-refinement-data 536 and the further-decoder-information 540.

The a-posteriori-refinement-data 536 is defined as a later knowledge for the further-decoding module 508 about the transmitted signal 110, the received signal 116, the bits therein, or a combination thereof. The a-posteriori-refinement-data 536 can be similar to the a-posteriori-decoder-data 526. The further-decoding module 508 can calculate the a-posteriori-refinement-data 536 as described for the a-posteriori-decoder-data 526 above. The further-decoding module 508 can also calculate the a-posteriori-refinement-data 536 to account for the latter parity 126.

The further-decoder-information 540 is defined as new information that is not derived from information input to the further-decoding module 508. The further-decoder-information 540 can be similar to the decoder-extrinsic-value 530. The further-decoding module 508 can calculate the further-decoder-information 540 as described above for the decoder-extrinsic-value 530. The further-decoding module 508 can also calculate the further-decoder-information 540 to account for the further parity 126.

The further-decoding module 508 can have an error-check module 550. The error-check module 550 is for evaluating the accuracy of the code word 122 or symbol as decoded by the decoder module 506, the further-decoding module 508, or a combination thereof. The error-check module 550 can check for the sampling accuracy, the modulation scheme, data format, or a combination thereof.

The error-check module 550 can further evaluate the accuracy by determining a checksum status 560. The error-check module 550 can determine the checksum status 560 using the parity bit 124, the latter parity 126, the LLR information relating to the parity information, such as the a-posteriori-decoder-data 526 or the further-decoder-information 540.

The error-check module 550 can determine the checksum status 560 by performing error detection using the parity bit 124, the latter parity 126 or by following forward error correction routine. For example, the error-check module 550 can perform the cyclic redundancy check (CRC) evaluation.

The further-decoding module 508 can set a flag or send a signal to accept the resulting code word or symbol as previously decoded by the decoder module 506, the further-decoding module 508, or a combination thereof when the error-check module 550 returns an acceptable value of the checksum status 560. The communication system 500 can stop analyzing and accept the particular instance of the code word 122 or the bits when the checksum status 560 is acceptable and move to the next instance of the code word 122.

When the checksum status 560 is not acceptable, the further-decoding module 508 can pass the further-decoder-information 540 to the decoder module 506, the access module 509, or both. The access module 509 can store the value of the further-decoder-information 540 as a stored feedback 580 for later access. The decoder module 506 can adjust the decoder-extrinsic-value 530 using the stored feedback 580 or the further-decoder-information 540 for communicating through the mobile station 102 of FIG. 1.

The access module 509 is for controlling the interaction between the decoder module 506 and the further-decoding module 508. The access module 509 can control the interaction between the two modules by controlling the data to the decoder module 506. The access module 509 can control the data to the decoder module 506 by allowing the further-decoder-information 540 to pass directly to the decoder module 506, setting the stored feedback 580, passing the stored feedback 580 to the decoder module 506, or a combination thereof based on a break condition.

The access module 509 can store all inputted values of the further-decoder-information 540 according to time or iteration. The access module 509 can also set the value of the stored feedback 580 as the value of the further-decoder-information 540 to retain only the last-received data. The access module 509 can use the first storage unit 214 of FIG. 2 to store the stored feedback 580.

The access module 509 can also set the value of the stored feedback 580 when a break condition occurs. The break condition can be a limitation on the number of executions, such as a conditional statement or a numerical loop limitation. The break condition can further be a signal or a flag received from the further-decoding module 508, the detector module 504, the decoder module 506, or a combination thereof.

The access module 509 can allow the further-decoder-information 540 to pass through from the further-decoding module 508 to the decoder module 506 when the break condition has not been met. When the break condition has been met, the access module 509 can set the access module 509 can set the value of the stored feedback 580 as the value of the further-decoder-information 540. The access module 509 can further send a signal or set a bit to stop the execution of the decoder module 506, the further-decoding module 508, or both.

Also, the decoder module 506, the further-decoding module 508, or both can be configured to operate only when receiving an input value from the decoder module 506, the further-decoding module 508, the access module 509, or a combination thereof. For example, the access module 509 can start the interaction between the two modules by passing an initial value, such as 0, to the decoder module 506 when the detector module 504 first sends the detector-extrinsic-information 520. The access module 509 can sustain the interaction by allowing the further-decoder-information 540 to pass between decoder module 506 and the further-decoding module 508.

Continuing with the example, the access module 509 can stop the interaction between the two modules by stopping the further-decoder-information 540 from passing between decoder module 506 and the further-decoding module 508. The access module 509 can reinitiate the interaction between the decoder module 506 and the further-decoding module 508 by passing the stored feedback 580 to the decoder module 506 when the detector module 504 subsequently sends the detector-extrinsic-information 520.

The decoder module 506 and the further-decoding module 508 can also independently check for the break conditions and respond accordingly. For example, if the break condition has not been satisfied, the decoder module 506 can adjust the detector-extrinsic-information 520 by recalculating the detector-extrinsic-information 520 as described above using the value of the further-decoder-information 540 as the a-priori-decoder-information 524. The decoder module 306 can pass the results of the recalculation as the decoder-extrinsic-value 530 to the further-decoding module 508.

The calculations and the interactions between the detector module 504, the decoder module 506, and the further-decoding module 508 can be implemented in a loop mechanism. The loop mechanism can be controlled by the break condition.

During the implementation of the loop mechanism, the communication system 500 can fail to receive, estimate, detect, decode, or a combination thereof for the received signal 116. The communication system 500 can send the negative acknowledgement 120 (NACK) of FIG. 1 back to the base station 106 of FIG. 1, which will prompt the base station 106 to retransmit the transmitted signal 110 or a portion or portions thereof.

The error-check module 550 can have a reply module 590. The reply module 590 can send the NACK 120 back to the base station 106 when the detector module 504, the decoder module 506, the further-decoding module 508, or a combination thereof fails to successfully detect or decode the received signal 116. The detector module 504 can detect the retransmission from the base station 106 following the NACK 120 and calculate new values of the detector-extrinsic-information 520.

The reply module 590 can store the calculated results of the detector module 504, the decoder module 506, the further-decoding module 508, or a combination thereof. The reply module 590 can sum the detector-extrinsic-information 520 over retransmissions and store the sum. Further, the reply module 590 can perform bit-level combining between the stored value of the detector-extrinsic-information 520 and the retransmitted data. The detector module 504 can adjust the detector-extrinsic-information 520 by recalculating the detector-extrinsic-information 520 using the summed value over the retransmission as the input parameter.

It has been discovered that the combination of the reply module 590 and the detector-extrinsic-information 520 provide increased efficiency in processing the received signal 116 and in managing resources at the base station 106. The reply module 590 and the detector-extrinsic-information 520 can accurately and efficiently process retransmitted signal by combining with the previously stored results before the NACK 120 and the retransmission. The stored data allows for faster and more accurate error correction and detection, also leading to decreased number of retransmissions.

For illustrative purposes, the communication system 500 is shown having the detector module 504 directly coupled to the decoder module 506 and the further-decoding module 508, and the decoder module 506 directly coupled to the further-decoding module 508. However, it is understood that the communication system 500 can be configured differently.

For example, the detector module 504, the decoder module 506, the further-decoding module 508, or a combination thereof can be directly coupled to the access module 509. The detector module 504, the decoder module 506, the further-decoding module 508, or a combination thereof can be coupled to each other through the access module 509 and the access module 509 can receive and pass all of the output information between the directly coupled modules as shown in FIG. 3.

Also for illustrative purposes, the communication system 500 is shown having the modules and sub-modules arranged in an exemplary arrangement. However, it is understood that the communication system 500 can have the modules configured differently. For example, the error-check module 550 can be an individual module and not a sub-module of the further-decoding module 508. Also, for example, the access module 509 can be a sub-module of the decoder module 506.

Figure 6:
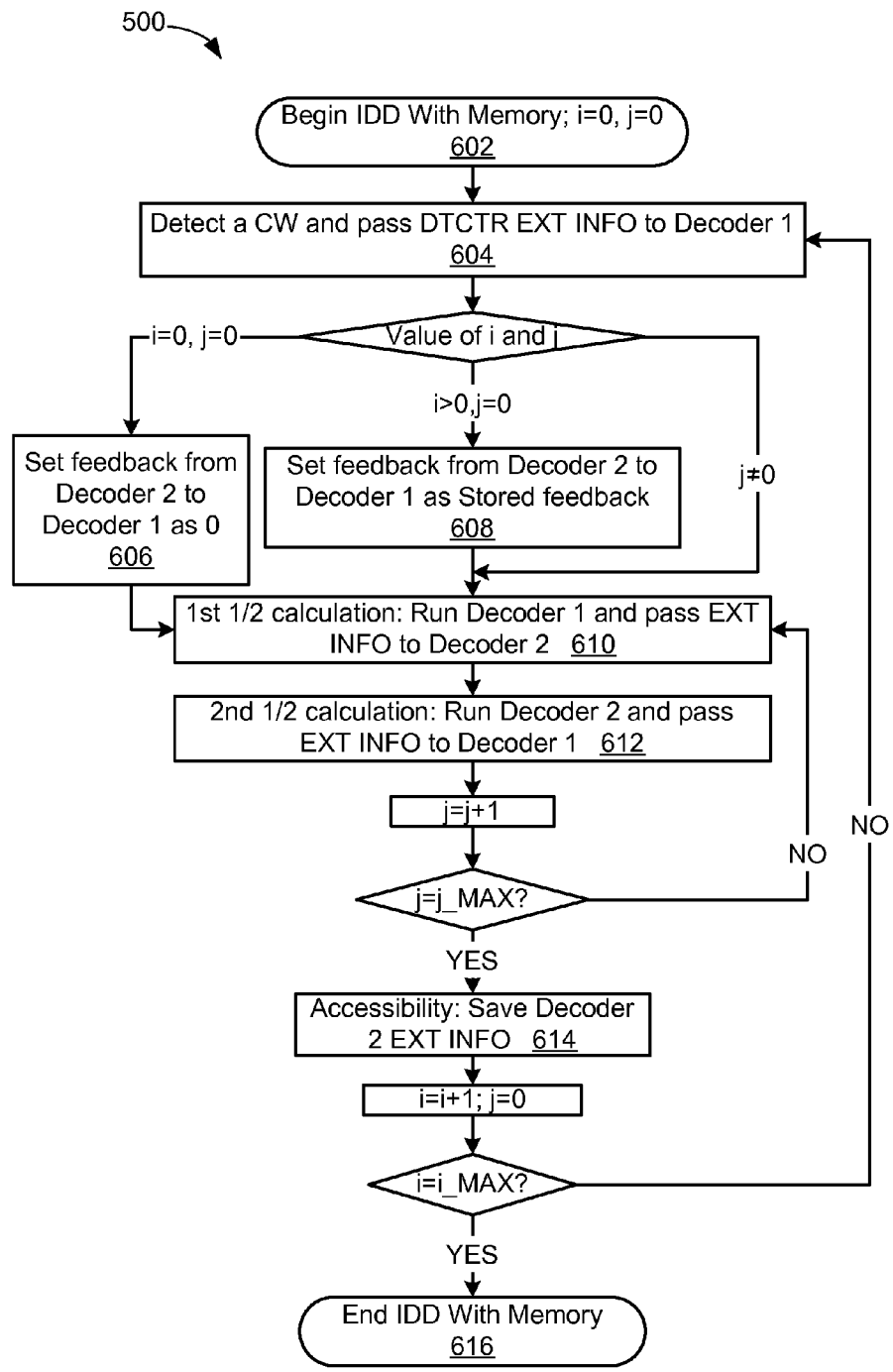
FIG. 6 is an example of the control flow of the communication system in the second embodiment.

Referring now to FIG. 6, therein is shown an example of the control flow of the communication system 500 in the second embodiment. The operational flow in FIG. 6 can show the overall interactions of the channel analysis module 502 of FIG. 5, the detector module 504 of FIG. 5, the decoder module 506 of FIG. 5, and the further-decoding module 508 of FIG. 5 for an exemplary scenario for the communication system 500.

For example, the communication system 500 can be implemented with IDD limit of i_MAX and a turbo-code limit of j_MAX as the break condition, and an IDD counter i and a turbo counter j. The communication system 500 can begin the IDD with memory processing in a begin IDD block 602.

The IDD counter and the turbo-code counter can be initialized to 0 during initial power up, resets, handovers, based on other conditions, or a combination thereof in the begin IDD block 602. The communication system 500, the hardware manufacturer, the software manufacturer, or a combination thereof can predetermine the IDD limit and the turbo-code limit based on limitations and delays of the communication system 500.

The communication system 500 can detect the code word 122 of FIG. 1 and pass the detector-extrinsic-information 520 of FIG. 5 to decoder module 506 in the begin IDD block 602. The detector module 504 can detect an instance of the code word 122 or symbol in the received signal 116 of FIG. 1 and calculate and pass the detector-extrinsic-information 520 to the decoder module 506 in a detection block 604.

When the IDD counter and the turbo-code counter are both 0, the communication system 500 can have the access module 509 set the feedback from the further-decoding module 508 to the decoder module 506 as 0 in a initialization block 606. The decoder module 506 can set the stored feedback 580 of FIG. 5 and the a-priori detector-information 512 of FIG. 5 to 0 in the initialization block 606.

When the IDD counter is greater than 0 and the turbo-code counter is 0, the communication system 500 can have the access module 509 set the last feedback from the further-decoding module 508 as an input to the decoder module 506 in a determine previous-result block 608. The access module 509 can pass the stored feedback 580 to the decoder module 506 and the decoder module 506 can set the value of the a-priori decoder information 524 of FIG. 5 as the stored feedback 580 in the determine previous-result block 608. The decoder module 506 can calculate and pass the decoder-extrinsic-value 530 of FIG. 5 to the further-decoding module 508 in a first-half calculation block 610.

The further-decoding module 508 can calculate and pass the further-decoder-information 540 of FIG. 5 to the decoder module 506 in a second-half calculation block 612. The further-decoding module 508 can also end the loop and find the decoding as acceptable based on the checksum status 560 of FIG. 5 of the error-check module 550 of FIG. 5.

The further-decoding module 508 can increment the turbo-code counter up by 1 and pass the further-decoder-information 540 to the decoder module 506. The decoder module 506 can recalculate the decoder-extrinsic-value 530 using the further-decoder-information 540 and the detector-extrinsic-information 520 in the first-half calculation block 610.

The repetition between the decoder module 506 and the further-decoding module 508 can continue as long as the turbo-code counter is less than the turbo-code limit. When the turbo-code counter is greater than or equal to the corresponding limit, the IDD counter can be incremented up by 1 and the turbo-code counter can be reset to 0.

When such conditions exist, the communication system 500 can save the further-decoder-information 540 in an accessibility block 614. The communication system 500 can have the access module 509 store the value of the further-decoder-information 540 as the stored feedback 580. The communication system 500 can also break the inner turbo loop by having the access module 509 not pass the further-decoder-information 540 to the decoder module 506. The further-decoding module 508 can also pass the decoder-extrinsic-value 530, the further-decoder-information 540, or a combination thereof to the detector module 504 in the accessibility block 614.

The stored feedback 580 can be stored in the access module 509 at this point or during each interaction between the decoder module 506 and the further-decoding module 508. The detector module 504 can recalculate the detector-extrinsic-information 520 using the inputs from the further-decoding module 508.

When the decoder module 506 receives the inputs from the detector module 504 after the initial outer loop corresponding to an initial instance of the code word, such as when receiving inputs with the IDD counter greater than 0, the decoder module 506 can use the stored feedback 580 corresponding to a previous instance of the code word from the access module 509 as an initial value in calculating the decoder-extrinsic-value 530 instead of 0 for a different or a subsequent instance of the code word. The decoder module 506 can use the stored feedback 580 and detector-extrinsic-information 520 corresponding to the previous instance of the code word as the a-priori information corresponding to the different or the subsequent instance of the code word.

The interactions between the decoder module 506, the further-decoding module 508, and the detector module 504 can continue as described above. The outer loop including the detector module 504 can continue as long as the IDD-code counter is less than the IDD-code limit. When the IDD-code counter is greater than or equal to the IDD-code limit, the communication system 500 can end the IDD with memory by ending the loop in an end loop block 616.

The calculations and the interactions between the decoder module 506 and the further-decoding module 508 can be used to generally implement the turbo code or the turbo detector. The calculations and the interactions including the detector module 504 can be used to generally implement the iterative-detection-decoding methods.

It has been discovered that the combination of the stored feedback 580 and the decoder-extrinsic-value 530 provides more accurate detection and decoding of the received signal 116, which can lead to better signal quality and less errors. The stored feedback 580 and the decoder-extrinsic-value 530 can estimate the previous results as the current starting point between the interactions from the detector module 504 and the decoder module 506. The estimation can lead to faster convergence to the estimated or actual values, which can improve the speed and quality of the detection.

It has further been discovered that the combination of the stored feedback 580 and the further-decoder-information 540 improves the transmission capacity the base station 106 of FIG. 1. The stored feedback 580 and the further-decoder-information 540 can improve error rate performance. The improved error rate performance can decrease the need for the base station 106 to retransmit data, which can improve the processing burden and the multiplexing capacity the base station 106.

It has yet further been discovered that the combination of the stored feedback 580, the detector-extrinsic-information 520, the decoder-extrinsic-value 530, the further-decoder-information 540 provides faster transmission rate between the base station 106 and the mobile station 102 of FIG. 1. The combination of the stored feedback 580, the detector-extrinsic-information 520, the decoder-extrinsic-value 530, the further-decoder-information 540 can update the LLR for the systematic bit, parity bit 124 of FIG. 1 and the latter parity 126 of FIG. 1, which can ensure correct detection of the signal at higher coding rate. Calculating the output extrinsic information for all encoded bits, including the parity bits can improve the performance of the mobile station 102 of FIG. 1.

It has also been discovered that the combination of the stored feedback 580 and the checksum status 560 can increase the efficiency in detecting and decoding the received signal 116. The stored feedback 580 and the checksum status 560 can function as a mechanism for early termination and decrease the number of necessary iterations.

The detector module 504, the decoder module 506, the further-decoding module 508, or a combination thereof can further use scale factors. The detector-extrinsic-information 520, the decoder-extrinsic-value 530, the further-decoder-information 540, or a combination thereof can be scaled using a calculated factor or a predetermined factor. The scale factors can be used to adjust the over-optimistic LLR as a result of using suboptimal detector and decoder. The use of the scale factors can be determined by the hardware rating 510 of FIG. 5.

For example, each module can have a predetermined equation that derives the scale factors from the hardware rating 510 for each module. Also, for example, each module can refer to a predetermined threshold and a value for the scale factor. The modules can compare the hardware rating 510 to the threshold and use the scale factor based on the comparison. The predetermined equations, thresholds, scale factor values, or a combination thereof can be preset by the communication system 500, the hardware manufacturer, the software manufacturer, or a combination thereof.

The processed symbol or code word can be used to process the message or data coming from or through the base station 106. For example, the methods described above can be used to synchronize the mobile station 102 and the base station 106 or to further detect and decode message or data in the received signal 116. The results of the detector module 304 of FIG. 3, the decoder module 306 of FIG. 3, the detector module 504, the decoder module 506, the further-decoding module 508, the received signal 116, or a combination thereof can be further processed and communicated to the user. The results can be displayed or audibly conveyed through the first user interface 218 of FIG. 2.

The communication system 100 can operate one of the detector module 304, the decoder module 306, the detector module 504, the decoder module 506, and the further-decoding module 508 at a time and completely process one code word of the received signal 116 at each iteration. The communication system 100 can also have multiple modules operating simultaneously or processing multiple code words of the received signal simultaneously.

The communication system 100 can have the detector module 304, the decoder module 306, the detector module 504, the decoder module 506, and the further-decoding module 508 in the serial configuration 401 of FIG. 4 or the parallel configuration. In serial configuration 401, the communication system 100 can have the detector module 304 detect all streams of a single code word within the received signal 116.

The communication system 100 can decode the single code word before the detector module 304 detects and processes a difference instance of the code word. The detector module can detect a subsequent code word within the received signal 116 using the decoder-extrinsic-value 330 of FIG. 3, the further-decoder-information 540, the detector-extrinsic-information 320 of the first instance of the code word 122, or a combination thereof.

In parallel configuration, the communication system 100 can have the detector module 304 detect all streams of all code words within the received signal 116. The decoder modules can decode all of the code words after the detection.

It has been discovered that the communication system 100 having the serial configuration 401 with the decoder module 306 and the further-decoding module 508 provide better error rate performance of the transmitted signal 110 of FIG. 1. The serial configuration 401 with the decoder module 306 and the further-decoding module 508 allow adjusting each successive detections based on the outputs of the decoder module 306 and the further-decoding module 508 for the previous detection.

The physical transformation of the a-posteriori detector-data 318 of FIG. 3, the detector-extrinsic-information 320 of FIG. 3, the a-posteriori-decoder-data 328 of FIG. 3, the decoder-extrinsic-value 330, or a combination thereof, over a period of time results in physical changes in the physical world, such as projected sounds during the phone call or displayed information. The movement in the physical world can be fed back to the communication system 100 to further operate the communication system 100. For example, changes in the detector-extrinsic-information 320, the decoder-extrinsic-value 330, or a combination thereof over a period of time can enable user to stream web-content or continue talking to another user.

Also, the physical transformation of the a-posteriori detector-data 516 of FIG. 5, the detector-extrinsic-information 520, the a-posteriori-decoder-data 526 of FIG. 5, the decoder-extrinsic-value 530, the further-decoder-information 540, or a combination thereof, over a period of time including during retransmissions following the NACK 120 of FIG. 1, results in movement in the physical world, such as correction or update of a displayed webpage or picture. The movement in the physical world can be fed back to the communication system 100 to further operate the communication system 100.

Further, the physical transformation of the received signal 116, such as the audible or visual depiction captured in the received signal 116, over a period of time results in movement in the physical world, such as the user following a route or continuing an audio-visual phone conversation. The physical transformation of the received signal 116 results in physical changes for the a-posteriori detector-data 318 or 516, the detector-extrinsic-information 320 or 520, the a-posteriori-decoder-data 328 or 526, the decoder-extrinsic-value 330 or 530, or a combination thereof. The movement in the physical world can be fed back to the communication system 100 to further operate the communication system 100.

It is understood that the various modules described above can be implemented as hardware in the first control unit 212 of FIG. 2, such as dedicated circuitry or programmed arrays. The different modules can also be implemented as separate hardware mechanism, circuit, or device (not illustrated) in the mobile station 102, the base stations, or a combination thereof.

Figure 7:
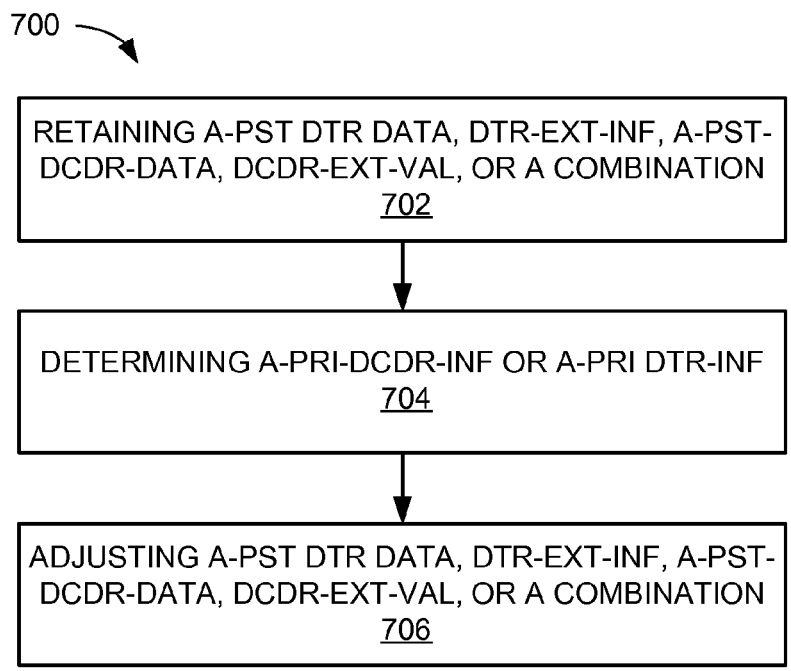
FIG. 7 is a flow chart of a method of operation of a communication system in a further embodiment of the present invention.

Referring now to FIG. 7, therein is shown a flow chart of a method 700 of operation of a communication system in a further embodiment of the present invention. The method 700 includes: retaining an a-posteriori detector-data, a detector-extrinsic-information, an a-posteriori-decoder-data, a decoder-extrinsic-value, or a combination thereof calculated from a received signal in a block 702; determining an a-priori-decoder-information or an a-priori detector-information from the a-posteriori detector-data, the detector-extrinsic-information, the a-posteriori-decoder-data, the decoder-extrinsic-value, or a combination thereof in a block 704; and adjusting the a-posteriori detector-data, the detector-extrinsic-information, the a-posteriori-decoder-data, the decoder-extrinsic-value, or a combination thereof using the a-priori-decoder-information or the a-priori detector-information for communicating through a device in a block 706.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the communication system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing communication system.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a communication system comprising:
    retaining an a-posteriori detector-data, a detector-extrinsic-information, an a-posteriori-decoder-data, a decoder-extrinsic-value, or a combination thereof calculated from a received signal and corresponding to a code word when a counter satisfies a break condition;
    determining an a-priori-decoder-information or an a-priori detector-information corresponding to a different code word from the a-posteriori detector-data, the detector-extrinsic-information, the a-posteriori-decoder-data, the decoder-extrinsic-value, or a combination thereof corresponding to the code word when the counter is an initial value; and
    adjusting the a-posteriori detector-data, the detector-extrinsic-information, the a-posteriori-decoder-data, the decoder-extrinsic-value, or a combination thereof corresponding to the different code word using the a-priori-decoder-information or the a-priori detector-information for communicating through a device.

2. The method as claimed in claim 1 wherein adjusting the a-posteriori detector-data, the detector-extrinsic-information, the a-posteriori-decoder-data, the decoder-extrinsic-value, or a combination thereof includes:
    recalculating the a-posteriori detector-data, the detector-extrinsic-information, or a combination thereof based on the a-priori detector-information; and
    recalculating the a-posteriori-decoder-data, the decoder-extrinsic-value, or a combination thereof based on the a-priori-decoder-information.

3. The method as claim in claim 1 wherein retaining the a-posteriori detector-data, the detector-extrinsic-information, the a-posteriori-decoder-data, the decoder-extrinsic-value, or a combination thereof includes accessing the a-posteriori detector-data, the detector-extrinsic-information, the a-posteriori-decoder-data, the decoder-extrinsic-value, or a combination thereof calculated in a previous iteration corresponding to the code word.

4. The method as claim in claim 1 wherein adjusting the a-posteriori detector-data, the detector-extrinsic-information, the a-posteriori-decoder-data, the decoder-extrinsic-value, or a combination thereof includes scaling the a-priori detector-information, the a-posteriori detector-data, the detector-extrinsic-information, the a-prion-decoder-information, the a-posteriori-decoder-data, the decoder-extrinsic-value, or a combination thereof to account for a hardware rating.

5. The method as claimed in claim 1 wherein adjusting the a-posteriori detector-data, the detector-extrinsic-information, the a-posteriori-decoder-data, the decoder-extrinsic-value, or a combination thereof includes adjusting the a-posteriori detector-data, the detector-extrinsic-information, the a-posteriori-decoder-data, the decoder-extrinsic-value, or a combination according to a serial configuration.

6. A method of operation of a communication system comprising:
    calculating a detector-extrinsic-information using a received signal and corresponding to a code word for estimating a transmitted signal;
    calculating the decoder-extrinsic-value corresponding to the code word using the detector-extrinsic-information;
    calculating a further-decoder-information using the decoder-extrinsic-value;
    determining a stored feedback from the further-decoder-information when a counter satisfies a break condition; and
    adjusting the decoder-extrinsic-value corresponding to a different code word using the stored feedback when the counter is an initial value for communicating through a device.

7. The method as claimed in claim 6 wherein calculating the detector-extrinsic-information includes calculating the detector-extrinsic-information according to a serial configuration.

8. The method as claimed in claim 6 wherein adjusting the decoder-extrinsic-value includes recalculating the decoder-extrinsic-value using the stored feedback.

9. The method as claimed in claim 6 further comprising:
    determining a parity bit and a latter parity using the received signal;
wherein:
    calculating the decoder-extrinsic-value includes calculating the decoder-extrinsic-value to account for the parity bit; and
    calculating the further-decoder-information includes calculating the further-decoder-information to account for the latter parity.

10. The method as claimed in claim 6 further comprising:
    summing the detector-extrinsic-information when the received signal is retransmitted in response to a negative acknowledgement; and
wherein calculating the decoder-extrinsic-value includes:
    adjusting the decoder-extrinsic-value using the sum of the detector-extrinsic-information for the received signal.

11. A communication system comprising:
    an access module configured to retain an a-posteriori detector-data, a detector-extrinsic-information, an a-posteriori-decoder-data, a decoder-extrinsic-value, or a combination thereof calculated from a received signal and corresponding to a code word when a counter satisfies a break condition;
a detector module, coupled to the access module, includes:
  a pre-detection module configured to determine an a-priori detector-information corresponding to a different code word from the a-posteriori detector-data, the detector-extrinsic-information, the a-posteriori-decoder-data, the decoder-extrinsic-value, or a combination thereof corresponding to the code word when the counter is an initial value;
  a detector-calculation module configured to adjust the a-posteriori detector-data, the detector-extrinsic-information, or a combination thereof corresponding to the different code word using the a-priori detector-information;
a decoder module, coupled to the access module, includes:
  a pre-decoding module configured to determine an a-priori-decoder-information corresponding to the different code word from the a-posteriori detector-data, the detector-extrinsic-information, the a-posteriori-decoder-data, the decoder-extrinsic-value, or a combination thereof corresponding to the code word when the counter is the initial value; and
  a decoder-calculation module configured to adjust the a-posteriori-decoder-data, the decoder-extrinsic-value, or a combination thereof corresponding to the different code word using the a-priori-decoder-information for communicating through a device.

12. The system as claimed in claim 11 wherein:
the detector-calculation module is configured to recalculate the a-posteriori detector-data, the detector-extrinsic-information, or a combination thereof based on the a-priori detector-information; and
the decoder-calculation module is configured to recalculate the a-posteriori-decoder-data, the decoder-extrinsic-value, or a combination thereof based on the a-priori-decoder-information.

13. The system as claimed in claim 11 wherein the access module is configured to access the a-posteriori detector-data, the detector-extrinsic-information, the a-posteriori-decoder-data, the decoder-extrinsic-value, or a combination thereof calculated in a previous iteration corresponding to the code word.

14. The system as claimed in claim 11 wherein:
the detector-calculation module is configured to scale the a-priori detector-information, the a-posteriori detector-data, the detector-extrinsic-information, or a combination thereof to account for a hardware rating; and
the decoder-calculation module is configured to scale the a-priori-decoder-information, the a-posteriori-decoder-data, the decoder-extrinsic-value, or a combination thereof to account for the hardware rating.

15. The system as claimed in claim 11 wherein:
the detector-calculation module is configured to adjust the a-posteriori detector-data, the detector-extrinsic-information, or a combination thereof according to a serial configuration; and
the decoder-calculation module is configured to adjust the a-posteriori-decoder-data, the decoder-extrinsic-value, or a combination thereof according to the serial configuration.

16. The system as claimed in claim 11 further comprising:
a further-decoding module, coupled to the decoder module, configured to calculate a further-decoder-information using the decoder-extrinsic-value;
wherein:
the decoder module is configured to adjust the decoder-extrinsic-value corresponding to a different code word using a stored feedback determined from the further-decoder-information.

17. The system as claimed in claim 16 wherein the detector module is configured to calculate the detector-extrinsic-information according to a serial configuration.

18. The system as claimed in claim 16 wherein the decoder module is configured to recalculate the decoder-extrinsic-value using the stored feedback.

19. The system as claimed in claim 16 wherein:
the detector module is configured to determine a parity bit and a latter parity using the received signal;
the decoder module is configured to calculate the decoder-extrinsic-value to account for the panty bit; and
the further-decoding module is configured to calculate the further-decoder-information to account for the latter parity.

20. The system as claimed in claim 16 further comprising:
a reply module, coupled to the further-decoding module, configured to sum the detector-extrinsic-information when the received signal is retransmitted in response to a negative acknowledgement; and
wherein:
the detector module is configured to adjust the decoder-extrinsic-value using the sum of the detector-extrinsic-information for the received signal.

* * * * *